United States Patent [19]

Keown et al.

[11] Patent Number: 5,781,410
[45] Date of Patent: Jul. 14, 1998

[54] DENSELY PACKED TELECOMMUNICATIONS EQUIPMENT ENCLOSURE

[75] Inventors: Mark Sherman Keown, Forest Grove; Casey Martin Bardue; John Reed Hannig, both of Portland; William R. Olsen, Hillsboro, all of Oreg.

[73] Assignee: NEC America, Inc., Melville, N.Y.

[21] Appl. No.: 587,974

[22] Filed: Jan. 17, 1996

[51] Int. Cl.$^6$ .................................................. H05K 7/20
[52] U.S. Cl. .................... 361/690; 174/52.1; 361/727; 361/818; 455/349
[58] Field of Search .......................... 165/80.3, 121–126; 220/4.02; 454/184; 312/257.1, 223.1, 223.4; 340/545, 546; 307/150; 379/428, 440; 455/347–349, 351; 174/50, 52.1, 35 R; 361/602, 622, 625, 627, 641, 644, 645, 676, 678, 690, 694, 695, 724–727, 816, 818, 826, 827

[56] References Cited

U.S. PATENT DOCUMENTS

| | | |
|---|---|---|
| 3,188,524 | 6/1965 | Williams . |
| 3,631,324 | 12/1971 | Jones ........................... 361/625 |
| 3,903,404 | 9/1975 | Beall ........................... 361/686 |
| 4,089,044 | 5/1978 | Gatto ........................... 361/422 |
| 4,802,060 | 1/1989 | Immel . |
| 4,901,202 | 2/1990 | Leschinger . |
| 5,136,463 | 8/1992 | Webster . |
| 5,150,277 | 9/1992 | Bainbridge ........................... 361/724 |
| 5,235,133 | 8/1993 | Roth et al. . |
| 5,239,128 | 8/1993 | Golden ........................... 174/50 |
| 5,299,098 | 3/1994 | Schassler ........................... 361/829 |
| 5,398,161 | 3/1995 | Roy ........................... 361/727 |

FOREIGN PATENT DOCUMENTS 0020866 1/1981 European Pat. Off. ............... 361/625

OTHER PUBLICATIONS

NEC America, Inc. sales brochure showing a previous version of the housing that is the subject of the application; 1995.

Newton Instrument Co., Inc., Sales Brochure, Outside Plant Enclosure, 7060 Series.

Newton Instrument Co., Inc., Sales Brochure, Outside Plant Enclosure, 7100 Series.

PC Magazine (see p. 2), IBM's PS/1, vol. 9, No. 14, Aug. 1990.

*Primary Examiner*—Gerald P. Tolin
*Attorney, Agent, or Firm*—Sughrue, Mion, Zinn, Macpeak & Seas, PLLC

[57] ABSTRACT

A telecommunications equipment enclosure, designed to be placed outdoors at a remote location, houses equipment to provide a large number of voice channels, an AC power supply, an AC/DC distribution panel, protector panels, a back-up battery plant, multiplexers, a fiber distribution panel, and a separate cable splice area. Other equipment may also be housed in the enclosure if needed. The enclosure is configurable to customers' requirements, and is extremely small and densely packed relative to its channel capacity.

34 Claims, 6 Drawing Sheets

5,781,410

DENSELY PACKED TELECOMMUNICATIONS EQUIPMENT ENCLOSURE

FIELD OF THE INVENTION

The present invention is directed to the field of remote enclosures for telecommunications equipment, and more particularly to a densely packed enclosure configurable to house switches and associated equipment for handling a large number of voice channels. The enclosure of the present invention is extremely small relative to its channel capacity.

BACKGROUND OF THE INVENTION

When installing telecommunications networks, it is often necessary or desirable to place digital loop carrier equipment and its associated power supplies, cable splicing areas, distribution panels and other network equipment in locations separate from any building structure. By housing such equipment in a "remote enclosure", it is accessible to the telephone service provider without having to give the provider access to the customer's premises.

Remote enclosures, which usually have been made of metal, tend to be large and expensive because the equipment housed in them is not mounted in the most space-efficient way. This inefficiency occurs because the equipment must be mounted to allow access to it for maintenance and for connecting the separate pieces of equipment together, while at the same time limiting access to certain equipment to only craftspersons of the requisite skill level. For example, connecting cables to telecommunications equipment may require a relatively low skill level, while repairing or replacing components within the equipment itself may require a higher skill level. It is desirable to allow a low-level person access to a cable splice compartment, but not to the telecommunications equipment itself.

It is also extremely desirable to provide emergency back-up battery power in proximity to the enclosure, and preferably within the enclosure to reduce costs. However, this leads to a tension between building a compact enclosure which will house the required amount of equipment, and providing adequate battery back-up power in a limited space.

Prior attempts by the assignee of the present application to build such a compact enclosure, as shown in FIG. 1, have featured a built-in battery compartment 101 and a fixed rack mount 102. While this enclosure is compact, it provides only limited access to the rear of the equipment for maintenance, etc., it holds only a small number of switches, and it does not provide flexibility in the amount of emergency back-up power.

SUMMARY OF INVENTION

It is therefore an object of the present invention to provide a densely packed remote telecommunications equipment enclosure which is extremely small relative to its channel capacity, which is configurable for various customer equipment requirements, and which is suitable for outdoor placement.

A further object of the present invention is to provide a remote enclosure, designed in a modular way, with an attached battery plant for back-up power.

A still further object of the present invention is to provide a remote enclosure with a cable splice area segregated to allow "division of craft"; for example, to allow craftspeople access to the cable splice area without being able to access the more complicated telecommunications equipment in the enclosure.

These and other objects of the present invention can be realized by providing an enclosure, preferably of aluminum, and having access doors to allow access to the equipment racks inside the enclosure, and to a cable splice compartment. A battery plant is attached to the enclosure, and has its own access door.

The enclosure has a stationary equipment rack, or "fixed rack" which may be configured to hold one or more fan shelves, Digital Loop Carrier (DLC) shelves, protector panels, and power supplies, according to the needs of the customer.

The enclosure also has a movable equipment rack, or "swing rack" mounting scheme. The swing rack, when opened, allows access to the rear of all the equipment for maintenance and for connecting the equipment together. The swing rack may be configured to hold one or more fiber distribution panels, one or more cross-connect panels, and one or more multiplexers, according to the needs of the customer. An AC/DC distribution panel may be permanently attached to the bottom of the enclosure.

A cable splice area is separated from the componentry of the telecommunications equipment by a bulkhead, and is accessible separately, thus achieving division of craft. Also, an emergency AC power inlet connector is provided on the outside of the housing, to allow emergency AC power to be quickly and easily connected during power outages.

A separate battery plant is attached to one side of the enclosure and contains a configurable number of batteries used to provide various levels of emergency back-up power. The battery plant is vented to allow any gases from the batteries to escape.

Cooling of the electronics is provided by a fan shelf which circulates air inside the enclosure, along with fans located inside the AC/DC distribution panel. The fans force the air through the equipment, allowing the air to carry the heat to the skin of the enclosure where the heat can be dissipated. To reduce solar loading, the outside of the enclosure may be covered with a white powder coat paint.

BRIEF DESCRIPTION OF THE DRAWINGS

The present invention will be more clearly understood from the following description in conjunction with the accompanying drawings, wherein.

DETAILED DESCRIPTION OF THE PREFERRED EMBODIMENTS

Figure 1:
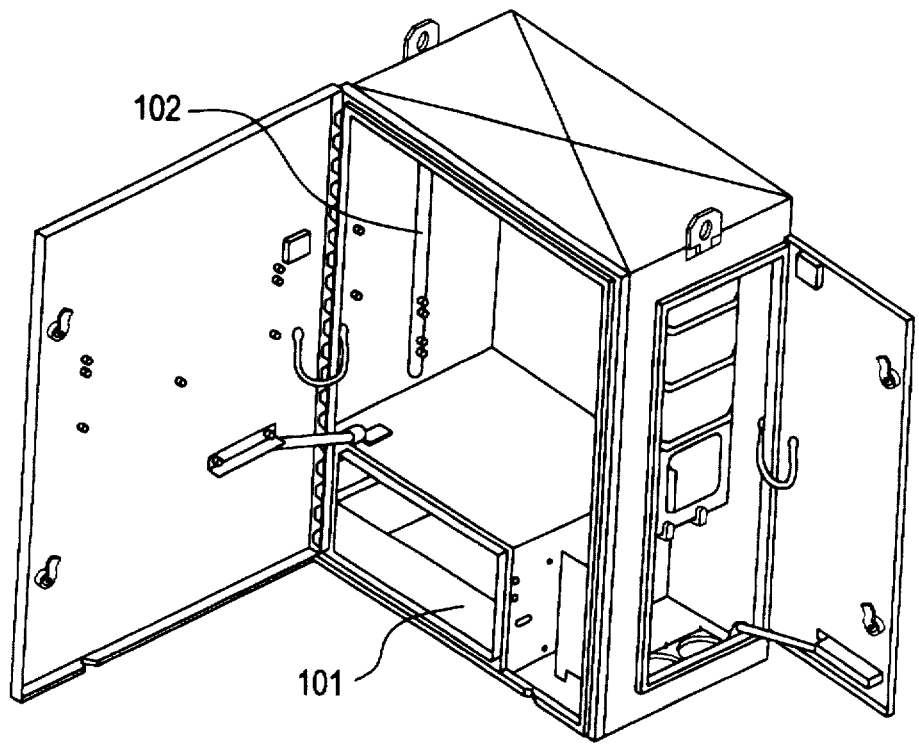
FIG. 1 is a front and right side isometric view of a prior art remote enclosure manufactured by the Assignee.
Figure 2:
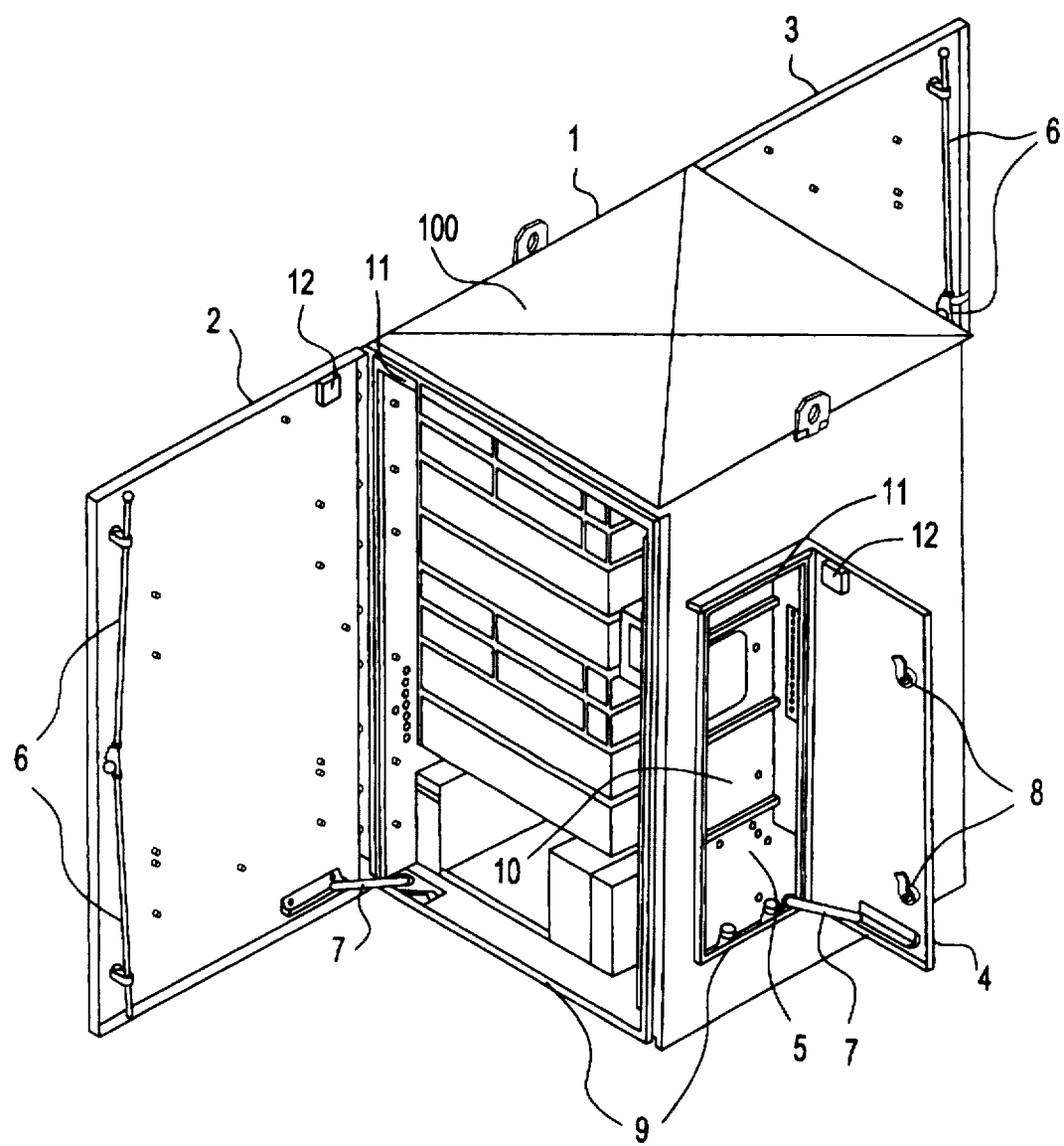
FIG. 2 is a front and right side isometric view of a remote enclosure in accordance with the invention, with front, rear and cable splice area doors open to reveal the contents of the enclosure.

A preferred embodiment of the enclosure according to the present invention is shown in FIG. 2. The enclosure is constructed of aluminum, and preferably of aluminum sheets welded together. In a particular embodiment which the inventors have been developing, the dimensions are 52.5 inches in height, 31.0 inches in width, and 36.0 inches in depth, and the sides are constructed of 0.125 inch thick aluminum sheets. Of course, these dimensions may be varied to accommodate the size and/or quantity of the equipment housed within.

The enclosure has a housing 1 with a front access door 2 and a rear access door 3. The doors 2, 3 preferably are as big as the entire front and rear sides of the housing 1, as shown. Both the front access door 2 and the rear access door 3 have two locking latches 6 to keep them securely closed, and a wind stay bracket 7 to secure the doors in the open position during service.

A smaller splice compartment door 4 is located on the right side of the housing 1 (in the preferred embodiment) to allow access to a cable splice compartment 5, which is separated from the rest of the housing 1 by an aluminum bulkhead 10. The bulkhead 10 allows craftspeople to access the cable splice compartment 5 without being able to access more complicated telecommunications equipment mounted elsewhere in the enclosure. The splice compartment door 4 also has a wind stay bracket 7 to secure it in the open position during service, and two locks 8 to keep it securely closed.

Switches 11 provide an alarm signal whenever any door is open. For each switch 11 there is furnished a corresponding contact pad 12 adhered to each door. A gasket 9 seals the doors 2, 3 and 4 and the housing 1 from water and dust intrusion.

The present invention was developed in conjunction with the NEC America (NECAM) ISC-303 DLC (Digital Loop Carrier) shelf to provide additional deployment opportunities for potential customers. The enclosure was designed specifically to house from one to four ISC-303 shelves, but is easily re-configurable to accept other equipment.

Figure 3:
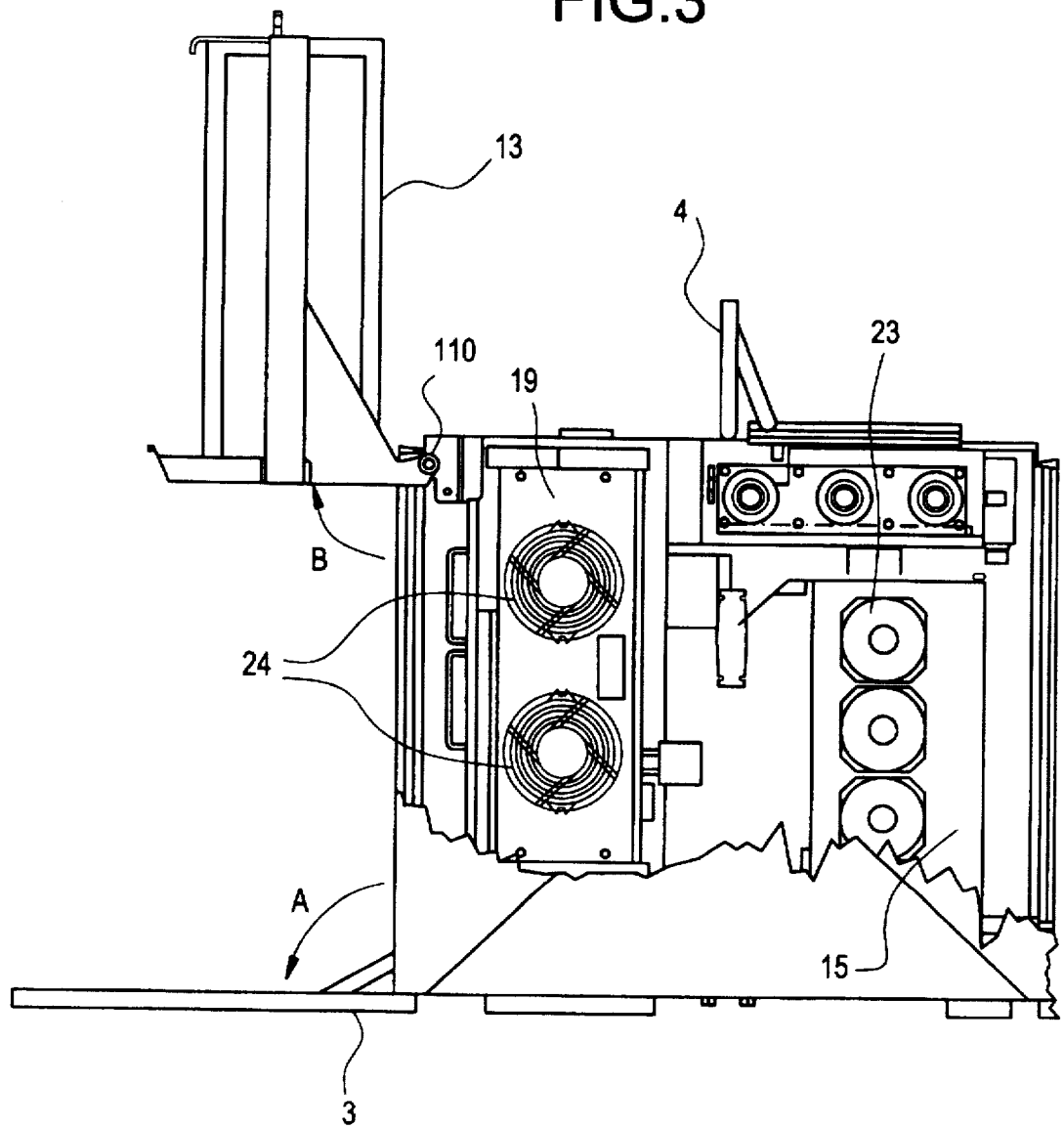
FIG. 3 is a top view of the enclosure of FIG. 2, showing the swing rack in its extended position and showing some of the contents of the enclosure.

Referring now to FIG. 3, behind the rear access door 3 (shown in its open position) there is provided a swing rack 13 (shown in its open position), which is configurable in a number of ways. In a preferred embodiment, the swing rack 13 holds two multiplexers, one fiber distribution panel, and one cross-connect panel. When rear access door 3 is opened in the direction of arrow A in FIG. 3, swing rack 13 can open in the direction of arrow B. When housed behind door 3 in its closed position, swing rack 13 fits over AC/DC distribution panel 19. The swing rack 13 pivots on hinges 110 connected to a top 100 of the housing 1 and the bottom (not shown) of the housing 1. Swing rack 13, when extended, allows access to the rear of all the equipment housed in the enclosure for maintenance and connectorization.

Figure 4:
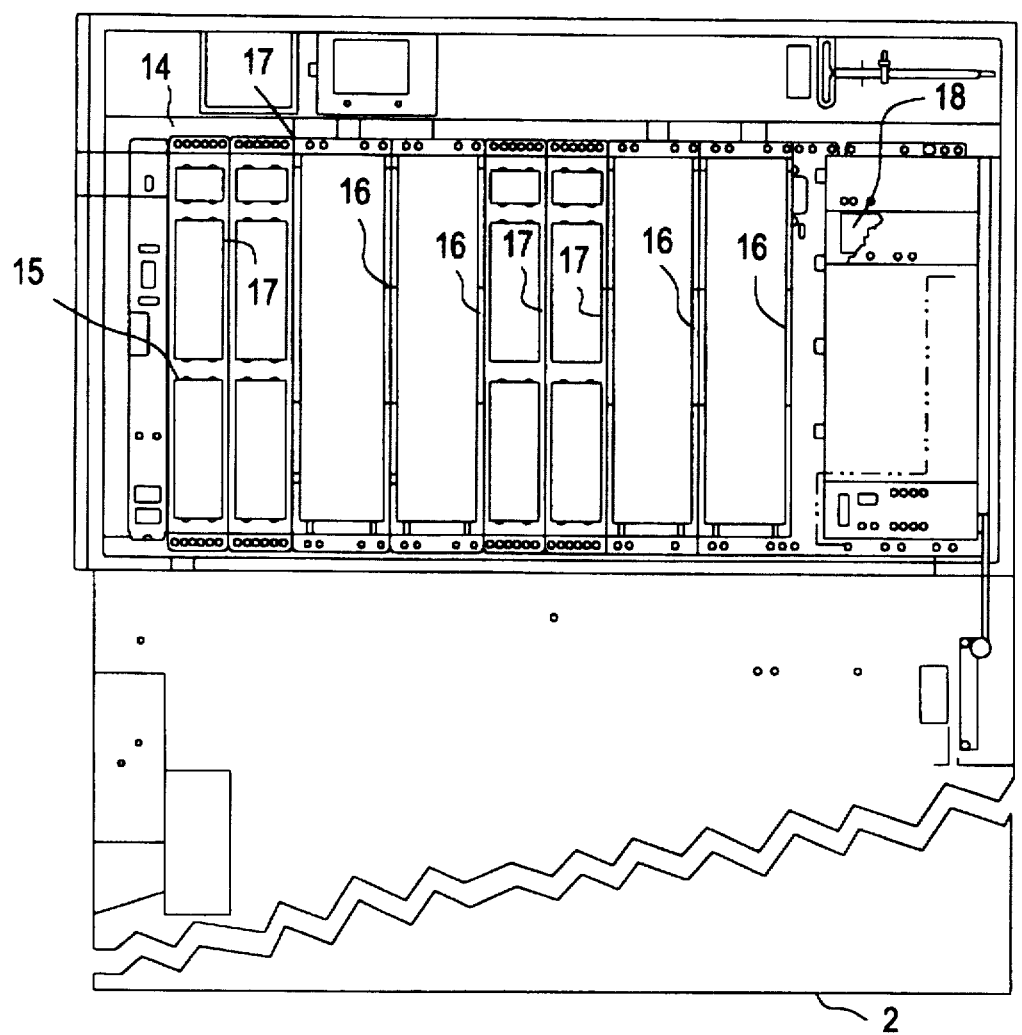
FIG. 4 is a front side elevation of the enclosure of FIGS. 2 and 3, with the front door open to reveal the contents of the enclosure therebehind.

Referring to FIG. 4, behind the front access door 2 (shown open) there is provided a fixed rack 14, which is configurable in a variety of manners. In a preferred embodiment, the fixed rack mount 14 holds one fan shelf 15, four NECAM ISC-303 DLC shelves 16 which provide up to 384 voice channels, four protector panels 17, and one power supply 18.

Figure 5:
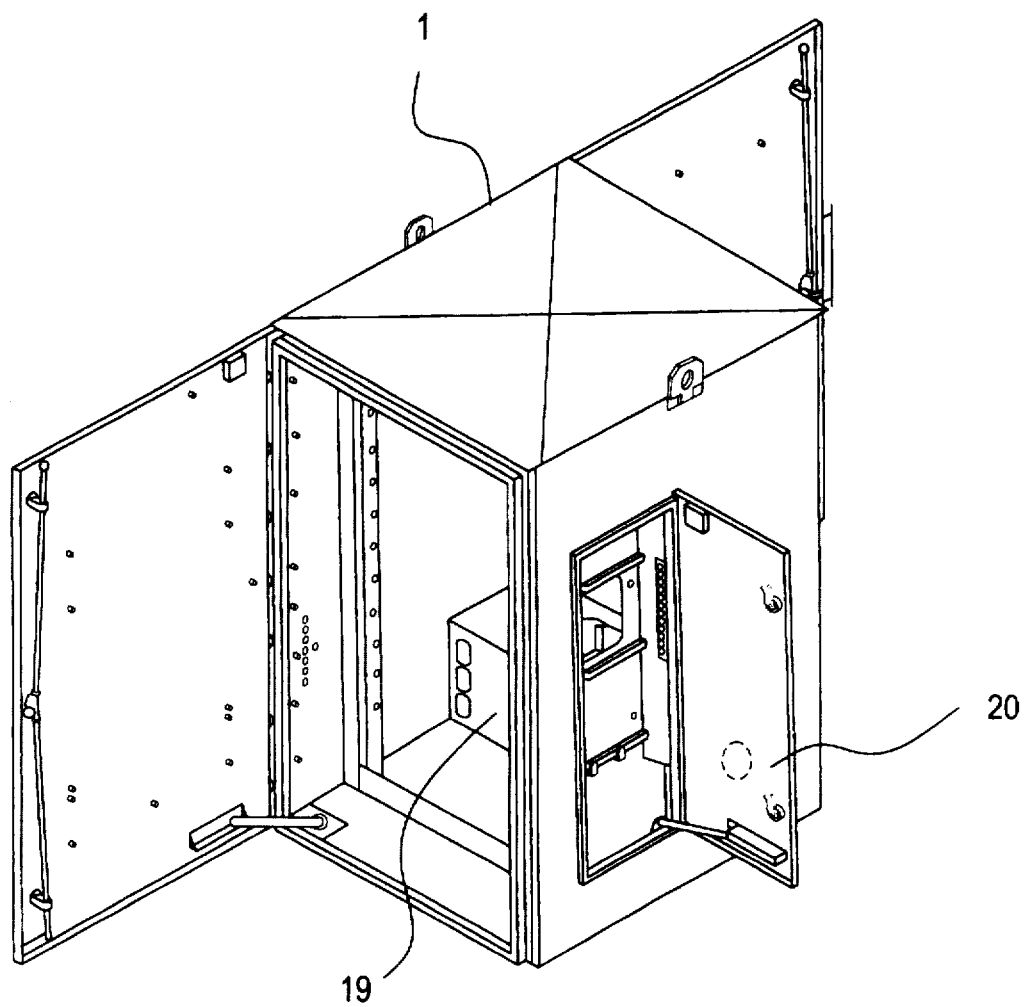
FIG. 5 is a front and right side isometric view of a remote enclosure in accordance with the invention, with front, rear and cable splice area doors open, and the right side contents of the enclosure removed to reveal the power supply as mounted.

Referring to FIG. 5, the AC/DC distribution panel 19 is permanently attached to the bottom of the housing 1 on its rear side. An emergency AC power inlet connector 20 is located on the right side of the housing 1 to allow emergency AC power to be quickly and easily connected during power outages.

Figure 6:
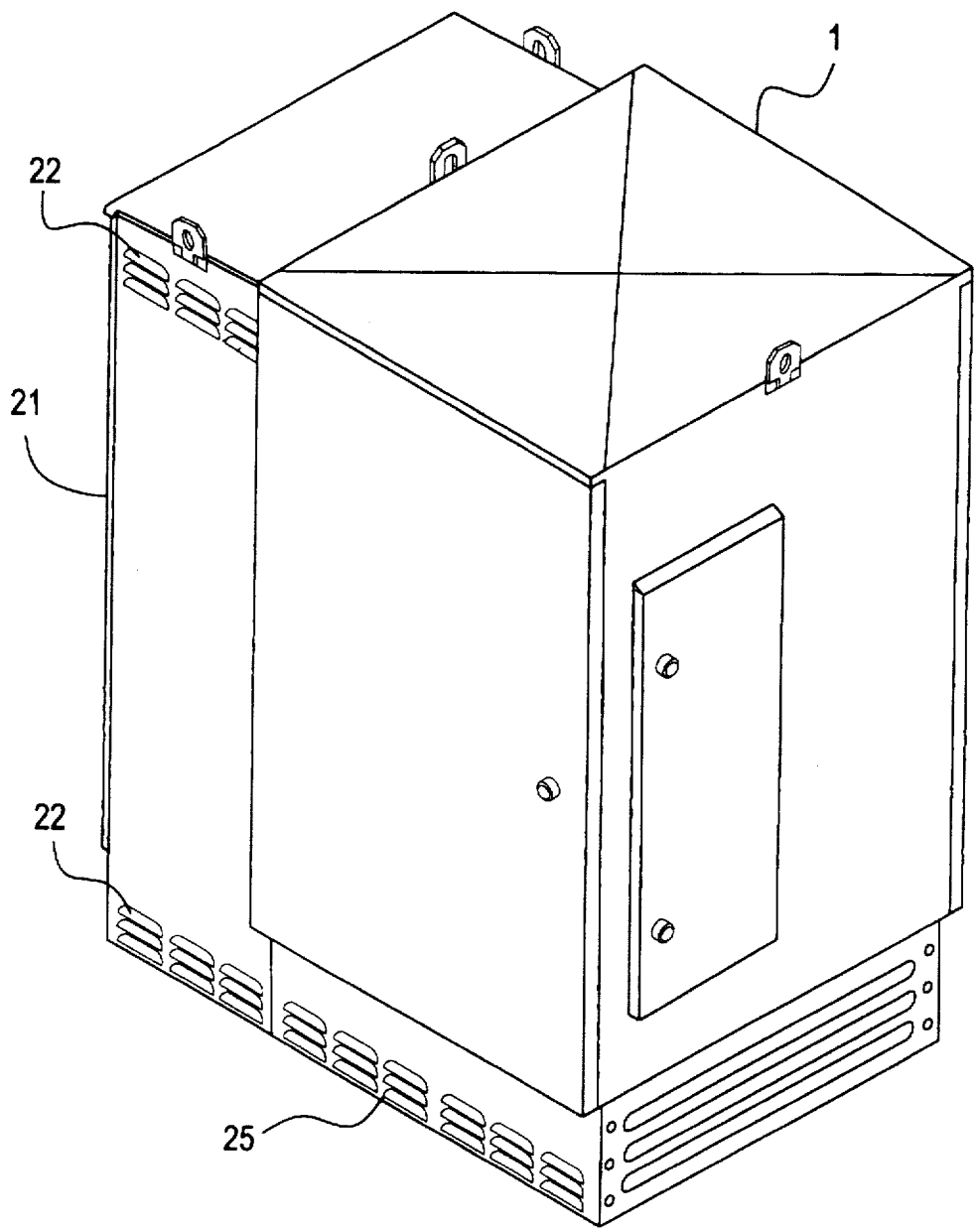
FIG. 6 is a front side elevation of the enclosure of FIGS. 2–5, with the battery plant attached.

Referring to FIG. 6, the housing 1 bolts to pedestal 25 and a battery plant 21 is bolted to the left side of the housing 1 and the pedestal 25. The battery plant 21 contains a configurable number of rechargeable batteries used to provide emergency back-up power. The batteries are continuously recharged by the power supply 18, which sends power first through the batteries and then to the equipment in the housing 1. The batteries are mounted in configurable racks or shelves (not shown). In a particular preferred embodiment of the invention, the battery plant is fully populated with batteries and provides eight hours of emergency power to equipment which fully populates the housing 1. The battery plant capacity may, however, be varied to provide a shorter duration of back-up power or back-up power for less equipment, according to the needs of the customer. For example, if the housing 1 happens to contain less than the maximum amount of equipment, then fewer back-up batteries will be needed to supply the desired duration of back-up power. If equipment is subsequently added to the housing 1, or if a longer back-up duration is desired, batteries may be added to the battery plant 21 to provide additional power. The battery plant 21 has vents 22 to allow gases from the batteries to escape. The battery plant 21 is also provided with battery heater pads (not shown) powered by the AC/DC distribution panel 19 to maintain minimum battery temperature.

In a preferred embodiment of the invention which the inventors are developing, the battery plant holds from zero to three strings of "gel cell" type lead-acid batteries, each string containing four batteries. Three strings are necessary in order to provide the maximum back-up capability. Note that although conventional lead-acid batteries are used in this particular embodiment, it is contemplated that other battery technologies, providing the necessary amp-hour ratings, may be used in the future as they become commercially feasible, or as power requirements for the equipment in housing 1 decrease.

Referring again to FIG. 3, cooling inside the housing 1 is accomplished by circulating air inside using the fans 23 in the fan shelf 15 along with the fans 24 in the AC/DC distribution panel 19. The fans move air through the equipment, allowing the air to carry the heat to the outer panels of the housing 1 and the doors 2, 3 and 4, where the heat can be dissipated to the environment. To reduce solar loading, the outside of the housing 1 and the doors 2, 3 and 4 are preferably covered with a white powder coat paint.

While a specific embodiment of the invention has been described herein, it will be apparent to those of skill in the art that other modifications may be made within the scope and spirit of the invention, and it is intended that the full measure of the invention be determined with reference to the following claims.

We claim:

1. A telecommunications equipment enclosure comprising:

a housing;

a fixed rack within said housing mounting a first plurality of telecommunications equipment;

a swing rack mounted swingably within said housing mounting a second plurality of telecommunications equipment, said swing rack pivotably attached to said housing and having an extended position and a retracted position, said swing rack being disposed within said housing when it is in the retracted position, and being disposed outside said housing when it is in the extended position thereby providing complete access to a rear portion of said second plurality of telecommunications equipment mounted on said swing rack and simultaneously providing access to a rear portion of said first plurality of telecommunications equipment mounted on said fixed rack;

cooling means, mounted within said housing, for circulating air within said housing;

battery plant means, fixedly mounted to an external surface of said housing, for providing backup power to said first and second pluralities of telecommunications equipment.

2. The enclosure of claim 1, wherein said housing has a plurality of external sides, a top, and a bottom, said enclosure further including at least one internal bulkhead defining a separate cable splice compartment, the cable splice compartment having a cable splice compartment door located in one of said external sides of the housing for providing access to the cable splice compartment without enabling access to components in said first and second pluralities of telecommunications equipment.

3. The enclosure according to claim 2, wherein the cable splice compartment door has locking and latching means for keeping said cable splice compartment door securely closed.

4. The enclosure according to claim 2, wherein the cable splice compartment door has a bracket for securing it in an open position away from said housing.

5. The enclosure according to claim 2, wherein the cable splice compartment door has an alarm means for signaling whenever said cable splice compartment door is open.

6. The enclosure according to claim 2, wherein the cable splice compartment door has a gasket disposed between itself and the housing for preventing water and dust from entering the housing.

7. The enclosure of claim 1, wherein said housing has a plurality of external sides, a top, and a bottom, the enclosure further comprising a fixed rack access door located in one of said external sides of the housing for providing access to said fixed rack and said first plurality of telecommunications equipment.

8. The enclosure according to claim 7, wherein the fixed rack access door has locking and latching means for keeping said fixed rack access door securely closed.

9. The enclosure according to claim 7, wherein the fixed rack access door has a bracket for securing it in an open position away from said housing.

10. The enclosure according to claim 7, wherein the fixed rack access door has an alarm means for signaling whenever said fixed rack access door is open.

11. The enclosure according to claim 7, wherein the fixed rack access door has a gasket disposed between itself and the housing for preventing water and dust from entering the housing.

12. The enclosure according to claim 7, wherein the fixed rack access door defines one of said external sides of said housing.

13. The enclosure of claim 1, wherein said housing has a plurality of sides, a top and a bottom, said enclosure further comprising a swing rack access door located in one of said external sides of the housing for providing access to said swing rack, wherein said swing rack access door swings in a first direction away from said housing to an open position and said swing rack swings in a second direction away from said housing when said swing rack access door is in said open position.

14. The enclosure according to claim 13, wherein the swing rack access door has locking and latching means for keeping said swing rack access door securely closed.

15. The enclosure according to claim 13, wherein the swing rack access door has a bracket for securing it in an open position away from said housing.

16. The enclosure according to claim 13, wherein the swing rack access door has an alarm means for signaling whenever said swing rack access door is open.

17. The enclosure according to claim 13, wherein the swing rack access door has a gasket disposed between itself and the housing for preventing water and dust from entering the housing.

18. The enclosure according to claim 13, wherein the swing rack access door defines one of said external sides of said housing.

19. The enclosure of claim 1, wherein said housing has a plurality of external sides, a top, and a bottom, wherein said battery plant means is attached to said bottom of said housing, said battery plant means having at least one battery for providing emergency power to said first and second pluralities of telecommunications equipment mounted in said housing.

20. The enclosure of claim 1, wherein said battery plant means has from zero to three strings of batteries, each of said strings containing four batteries, for providing emergency power to said first and second pluralities of telecommunications equipment mounted in said housing.

21. The enclosure of claim 1, further comprising an AC/DC distribution panel, fixedly mounted to the bottom of said housing, to provide power to said first and second pluralities of telecommunications equipment and to said cooling means.

22. The enclosure of claim 1, wherein said cooling means comprises at least one fan shelf mounted in at least one of said fixed rack and said swing rack.

23. The enclosure according to claim 1, further comprising a coating of powder coat paint disposed over an outer surface of said housing to reduce solar loading.

24. The enclosure according to claim 1, wherein said fixed rack and said swing rack are arranged for mounting the first and second pluralities of telecommunications equipment comprising equipment selected from the group consisting of a digital loop carrier, a protector panel, a fiber distribution panel, a cross-connect panel, a power supply and a multiplexer.

25. A telecommunications equipment enclosure comprising:

a generally rectilinear housing having a plurality of external sides, a top, a bottom and at least one internal bulkhead defining a separate cable splice compartment, the cable splice compartment having a cable splice compartment door located in a first external side of the housing for providing access to the cable splice compartment only;

a fixed rack, located inside the housing, for mounting a first plurality of telecommunications equipment within the housing;

a fixed rack access door defining a second external side of the housing for providing access to the fixed rack and the first plurality of telecommunications equipment;

a swing rack for mounting a second plurality of telecommunications equipment, said swing rack being pivotably attached to the housing and having an extended position and a retracted position, said swing rack being disposed within the housing when it is in the retracted position, and being disposed outside the housing when it is in the extended position, thereby providing access to a rear portion of the second plurality of telecommunications equipment mounted on the swing rack and simultaneously providing access to a rear portion of the first plurality of telecommunications equipment mounted on the fixed rack;

a swing rack access door defining a third external side of the housing for providing access to the swing rack, wherein said swing rack access door swings in a first direction to allow said swing rack mount to pivot away from said housing in a second, opposite direction;

a battery plant attached to a fourth external side of the housing, outside the housing and having at least one battery for providing emergency power to the telecommunications equipment mounted in the housing; and cooling means for circulating air inside the housing.

26. The enclosure according to claim 25, further comprising an AC/DC distribution panel, fixedly mounted to the bottom of the housing, to provide power to the first and second pluralities of telecommunications equipment and to the cooling means.

27. The enclosure according to claim 25, wherein the cooling means comprises at least one fan shelf mounted in at least one of the fixed rack or the swing rack.

28. The enclosure according to claim 25, wherein the cable splice compartment door, the fixed rack access door, and the swing rack access door each have locking and latching means for keeping them securely closed.

29. The enclosure according to claim 25, wherein the cable splice compartment door, the fixed rack access door, and the swing rack access door each have a bracket for securing them in the open position during service.

30. The enclosure according to claim 25 further comprising alarm means, connected to at least one of the cable splice compartment door, the fixed rack access door, and the swing rack access door, for signaling when any one of said doors are open.

31. The enclosure according to claim 25, further comprising a plurality of gaskets, disposed respectively between the housing and the cable splice compartment door, the fixed rack access door, and the swing rack access door, for preventing water and dust from entering the housing.

32. The enclosure according to claim 25, further comprising a coating of powder coat paint disposed over an outer surface of said housing to reduce solar loading.

33. The enclosure of claim 25, wherein said battery plant has from zero to three strings of batteries, each of said strings containing four batteries, for providing emergency power to said first and second pluralities of telecommunications equipment mounted in said housing.

34. The enclosure according to claim 25, wherein said fixed rack and said swing rack are arranged for mounting the telecommunications equipment comprising equipment selected from the group consisting of a digital loop carrier, a protector panel, a fiber distribution panel, a cross-connect panel, a power supply and a multiplexer.

* * * * *